(12) United States Patent
Chung et al.

(10) Patent No.: US 8,585,874 B2
(45) Date of Patent: Nov. 19, 2013

(54) METHOD OF PREPARING POSITIVE ACTIVE MATERIAL FOR LITHIUM BATTERY

(75) Inventors: Kyung Yoon Chung, Seoul (KR); Byung Won Cho, Seoul (KR); Seong-rae Lee, Seoul (KR); Hwa Young Lee, Seoul (KR); Ji-Ae Choi, Seoul (KR)

(73) Assignee: Korea Institue of Science and Technology (KR)

( * ) Notice: Subject to any disclaimer, the term of this patent is extended or adjusted under 35 U.S.C. 154(b) by 500 days.

(21) Appl. No.: 12/625,646

(22) Filed: Nov. 25, 2009

(65) Prior Publication Data
US 2011/0056824 A1 Mar. 10, 2011

(30) Foreign Application Priority Data
Sep. 9, 2009 (KR) .................. 10-2009-0085059

(51) Int. Cl.
*C23C 14/34* (2006.01)
(52) U.S. Cl.
USPC ............ 204/192.17; 204/192.12; 204/192.15; 204/192.16
(58) Field of Classification Search
USPC .............. 204/192.12, 192.15, 192.16, 192.17
See application file for complete search history.

(56) References Cited

U.S. PATENT DOCUMENTS

| | | | | |
|---|---|---|---|---|
| 4,920,094 A | * | 4/1990 | Nogawa et al. | ............... 505/475 |
| 5,292,601 A | | 3/1994 | Sugeno et al. | ................ 429/197 |
| 6,113,754 A | * | 9/2000 | Oh et al. | .................. 204/192.17 |
| 6,632,563 B1 | * | 10/2003 | Krasnov et al. | ............... 429/162 |
| 2007/0125638 A1 | * | 6/2007 | Zhang et al. | ............. 204/192.15 |
| 2007/0292759 A1 | * | 12/2007 | Ugaji et al. | ................... 429/223 |

FOREIGN PATENT DOCUMENTS

| | | | |
|---|---|---|---|
| EP | 2214248 | * | 4/2010 |
| JP | 9-055210 | | 2/1997 |
| JP | 11-016566 | | 1/1999 |
| JP | 11-283615 | | 10/1999 |
| KR | 10-2001-0085726 | | 9/2001 |
| KR | 10-2002-0029813 | | 4/2002 |
| KR | 2002-0066548 | | 8/2002 |
| KR | 10-2007-0027985 | | 3/2007 |
| WO | WO 2009/063747 | * | 5/2009 |

OTHER PUBLICATIONS

Office Action issued by the Korean Patent Office on Jun. 21, 2011 in connection with corresponding Korean Patent Application No. 10-2009-0085059.

* cited by examiner

*Primary Examiner* — Rodney McDonald
(74) *Attorney, Agent, or Firm* — Ostrolenk Faber LLP (57) ABSTRACT

Disclosed is a method of preparing a positive active material for a lithium battery. The method comprises: depositing a positive active material on an electrode on a substrate (1); and putting metal chips on a metal oxides target and performing a sputtering process, thereby depositing mixed metal-oxides on the positive active material (2). In another aspect, the method comprises: preparing an electrode active material; preparing a precursor solution including the electrode active material; and printing the precursor solution on the substrate, and evaporating a solvent at a temperature of 80-120° C.

8 Claims, 9 Drawing Sheets

Amorphous Mixed Metal-Oxides $LiCoO_2$ 620 nm

Substrate

METHOD OF PREPARING POSITIVE ACTIVE MATERIAL FOR LITHIUM BATTERY

RELATED APPLICATION

The present disclosure relates to subject matter contained in priority Korean Application No. 10-2009-0085059, filed on Sep. 9, 2009, which is herein expressly incorporated by reference in its entirety.

BACKGROUND OF THE INVENTION

1. Field of the Invention

The present invention relates to a method of preparing a positive active material for a lithium secondary battery, and particularly, to a method of preparing a positive active material capable of enhancing cell capacity, cycle performance, safety property, and efficiency by preventing a side reaction between a positive active material and an electrolyte, and by enhancing electric conductivity of the positive active material.

2. Background of the Invention

As metal oxides and phosphor oxides positive active materials for lithium secondary batteries, $LiCoO_2$, $LiMn_2O_4$, $LiMnO_2$, $LiNiO_2$, $LiCO_{1/3}Ni_{1/3}Mn_{1/3}O_2$, $V_6O_{13}$, $V_2O_5$, $LiFePO_4$ or $(PO_4)_3$, are being commonly used. As a metal oxides and phosphor oxides negative active material for lithium secondary batteries, a transition metal oxide, $Li_4Ti_5O_{12}$ is being commonly used. And, $MnO_2$ is being commonly used as a positive active material for lithium primary batteries.

As the most representative positive active material for lithium secondary batteries, $LiCoO_2$ is being widely used because of its layered structure. Owing to the layered structure of a hexagonal system which belongs to a space group (R-3m) where $Li^+$ and $Co^{3+}$ are alternately positioned at an octahedral site between an oxygen ion layer having a highest density and an adjacent layer thereto, intercalation and deintercalation for lithium ions are facilitated. Under these structural characteristics, the $LiCoO_2$ has stable charge and discharge characteristics, high thermal stability, high specific capacity, and high electric conductivity.

However, the $LiCoO_2$ has the following disadvantages.

Firstly, the $LiCoO_2$ is more costly than other positive active materials such as $LiNiO_2$ and $LiMn_2O_4$. Secondly, the $LiCoO_2$ has a low concentration of lithium ions that can be intercalated thereto for maintenance of the structural stability during charge and discharge processes. During the charge process, lithium ions are separated from a lithium layer to form an empty space, and $Co^{4+}$ ions having similar diameters to each other among $Co^{4+}$ ions in Co-layers move to the empty space to fill the empty space. The $Co^{4+}$ ions having moved to the empty space enhance stability of a hexagonal structure, and prevent a phase transition from a monoclinic structure to a hexagonal structure. However, the $Co^{4+}$ ions hinder movement of the lithium ions, thereby accelerating polarization during the charge and discharge processes. This polarization becomes severe at a high voltage (>4.5V) where the lithium ions are separated from the lithium layer by 50% or more than.

Another problem occurring during the charge and discharge processes at a voltage more than 4.2V may include Co-dissolution due to a side reaction between an electrode and an electrolyte. As a voltage increases, Co and O are dissolved from each other due to instability of the layered structure. At the same time, an oxidation reaction and a dissolution reaction between a Li salt and an organic solution which consist of the electrolyte are accelerated. And, a component of the electrolyte, $LiPF_6$ is dissolved to generate HF. And, the generated HF reacts with $LiCoO_2$ to form a new film (Solid Electrolyte Interface: SEI) on the electrode. This may lower conductivity of the lithium ions very much to increase mass transfer resistance. And, a high polymer is generated on the surface of an anode through positive ion polymerization while Ethylene Carbonate (EC) is oxidized. Since the generated high polymer is an electric insulator, it increases charge transfer resistance.

In order to solve these problems of the conventional electrode active material, there have been proposed methods for doping other elements to the electrode active material such as $LiCoO_2$ or $LiNiO_2$. U.S. Pat. No. 5,292,601 discloses $Li_xMO_2$(M is one or more elements among Co, Ni and Mn, and $0.5 \leq x \leq 1$) as a positive active material for enhancing performance of $LiCoO_2$. Japanese Patent Laid-Open No. 9-55210 discloses a surface-modified positive active material prepared by coating alkoxide of Co, Al or Mn on $LiNiO_2$, and then by heat-treating the coated resultant. And, Japanese Patent Laid-Open No. 11-16566 discloses a lithium-based oxide as a surface-modified positive active material, the lithium-based oxide coated with metal and crystalline oxides of Ti, Bi, B, Cu, Si, Sn, Ga, W, Zr or Mo.

However, the above methods have the following problems. Firstly, an initial temperature at which the surface of a positive active material and an electrolyte solution react with each other, i.e., a temperature ($T_s$) at which oxygen coupled to metal of the positive active material is separated from the metal during a charge process is not sufficiently increased. Secondly, a heating value occurring during a dissolution process is not sufficiently decreased.

As a similar technique to the present invention, there has been proposed Korean Patent Laid-Open No. 2002-066548 relating to a positive active material prepared by forming an amorphous oxide coating layer on mixed lithium metal oxides. The Korean Patent discloses a method of preparing a positive active material having been surface-coated with an amorphous material, comprising synthesizing mixed lithium metal oxides powder, additionally synthesizing an amorphous material, mixing the mixed lithium metal oxides powder and the amorphous material with each other, and heat-treating the mixture at 600° C. for five hours. However, while the heat-treatment is performed at a high temperature, the coating layer, the mixed lithium metal oxides has a high probability to be changed to a crystalline layer. And, in the Korean Patent Laid-Open No. 2002-066548, it is assumed that the material of the coating layer is amorphous without verifying the formation of an amorphous phase. Furthermore, according to the Korean Patent Laid-Open No. 2002-066548, the mixed lithium metal oxides have a high probability to be presented in the form of a mixture that the mixed lithium metal oxides and the material of the coating layer are uniformly distributed, rather than the surface of the mixed lithium metal oxides is coated with the coating layer. Korean Patent Laid-Open No. 2007-027985 discloses an electrode active material having a double layer structure of a core-shell structure. However, both the core and the shell include lithium ions. A large number of patents and theses rather than the above patents mention a coating technique for a positive active material. However, they merely mention a coating technique by a crystalline material. That is, there have not been proposed any techniques capable of enhancing ion conductivity, and capable of preventing a side reaction between an electrolyte and a positive active material, and corrosion of metal oxides by implementing a sophisticated amorphous mixed metal-oxides coating using a thin film processing.

SUMMARY OF THE INVENTION

Therefore, an object of the present invention is to provide a method of preparing a coated positive active material, capable of increasing a specific surface area of an electrode by sophisticatedly preparing an amorphous coating layer on the surface of the positive active material by using a thin film forming process, capable of preventing a side reaction between the positive active material and an electrolyte and enhancing electric conductivity by undergoing a surface coating process, and thus capable of implementing enhanced cycle performance, safety property, and efficiency characteristics for batteries.

Another object of the present invention is to provide a method of preparing a positive active material capable of enhancing ionic conductivity and capable of preventing a side reaction of a crystalline coating layer and corrosion of metal oxides, by preparing an amorphous mixed metal-oxides coating layer.

Still another object of the present invention is to provide a battery having stable cycle performance by minimizing melting of a specific component of an active material (Co in case of $LiCoO_2$, Mn in case of $LiMn_2O_4$, etc.) and preventing a corrosion reaction at a high voltage, by preventing a secondary reaction between a positive active material and an electrolyte, by coating the surface of the positive active material with an amorphous mixed metal-oxides. Here, the surface of the positive active material is coated with the amorphous mixed metal-oxides since cycle performance of the battery at a high voltage is greatly influenced by the secondary reaction at an interface between the positive active material and the electrolyte.

Yet still another object of the present invention is to provide a battery having enhanced performance by reducing resistance of an electrode and enhancing charge and discharge characteristics, by implementing mixed metal-oxides having high electric conductivity.

To achieve these and other advantages and in accordance with the purpose of the present invention, as embodied and broadly described herein, there is provided a method of preparing a positive active material for a lithium battery, comprising: depositing a positive active material on an electrode on a substrate (1); and putting metal chips on a metal oxides target and performing a sputtering process, thereby depositing mixed metal-oxides on the positive active material (2).

The method may further comprise heat-treating the substrate having the positive active material thereon at a high temperature (1'). The method may further comprise additionally heat-treating the substrate having the mixed metal-oxides thereon (2'). And, the mixed metal-oxides may have an amorphous phase.

The step (2) may be performed by cooling the target to a temperature of 5-15° C. And, the heat-treating in the steps (1) and (2) may be simultaneously performed while depositing the positive active material or the mixed metal-oxides on the substrate, by applying a voltage or a current to the substrate.

According to another aspect of the present invention, there is provided a method of preparing a positive active material for a lithium battery, comprising: preparing an electrode active material; preparing a precursor solution including the electrode active material; and printing the precursor solution on the substrate, and evaporating a solvent at a temperature of 80-120° C.

The method of preparing a positive active material for a lithium battery according to the present invention may have the following advantages.

Firstly, resistance of the electrode may be minimized by preventing a side reaction due to a secondary reaction between the positive active material of the electrode and the electrolyte, and by preventing formation of a solid electrolyte interface (SEI).

Secondly, structural stability of the positive active material may be enhanced, and electric conductivity and ionic conductivity may be enhanced, thereby enhancing cycle performance and efficiency of the battery.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE INVENTION

Description will now be given in detail of the present invention, with reference to the accompanying drawings.

The present invention may be applied to prepare a positive active material for small lithium secondary batteries for the conventional small IT devices, medium lithium secondary batteries for hybrid automobiles, plug-in hybrid automobiles, or electric automobiles, and fixed type large and medium lithium secondary batteries for new recyclable energy.

A method of preparing a positive active material for a lithium battery will be explained in more detail.

Firstly, a positive active material is deposited on an electrode on a substrate. As the electrode, a Pt electrode may be used. In order to form a mixed metal-oxides thin film on the positive active material, metal chips are put on a metal-oxides target, and then are sputtered. As the metal chips, used are one or more mixtures selected from a group consisting of Mg, Al, Co, Ni, K, Na, Ca, Si, Fe, Cu, Zn, Ti, Sn, V, Ge, Ga, B, P, Se, Bi, As, Zr, Mn, Cr, Ge, Sr, V, Sc, Y and Ta. And, as the metal-oxides, used is one selected from a group consisting of $AlO_x$, $SnO_x$, $ZrO_x$, $ZnO_x$, $CuO_x$, $CoO_x$, $TiO_x$, $CrO_x$, $WO_x$, $CaO_x$ and $MgO_x$ ($0<x\leq3$).

Before the sputtering, the substrate having the positive active material deposited thereon may be heat-treated at a high temperature. This may enhance crystallinity of the deposited material. The heat-treatment at a high temperature is performed at a temperature of 100-1000° C. for several minutes to one hour under vacuum or atmospheric pressure conditions.

After the sputtering, additional heat-treatment may be performed. This is in order to enhance a bonding force between the positive active material and the mixed metal-oxides coating layer. The additional heat-treatment is performed at a temperature of 100-500° C. for several minutes to one hour under 1~7 mTorr pressure conditions. Preferably, the additional heat-treatment is performed at a relatively low temperature. Preferably, the mixed metal-oxides deposited on the substrate by the sputtering has an amorphous phase. The reason is because the amorphous phase has more excellent side reaction restrain force and ion conductivity than a crystalline phase. The additional heat-treatment is performed at a relatively low temperature in order to prevent crystallinity of the deposited mixed metal-oxides layer. Furthermore, in case of a pressure lower than the above pressure, a deposition ratio may be degraded. And, in case of a pressure higher than the above pressure, crystal growth may occur.

The sputtering for depositing the mixed metal-oxides on the substrate may be performed by cooling the target to a temperature of 5-15° C. During the sputtering, heat is generated between the target and the substrate. Due to this generated heat, an atom activity may be increased to crystallize the coating layer. Accordingly, the target is cooled to the temperature of 5-15° C. for prevention of crystallinity.

While the positive active material and the mixed metal-oxides are deposited on the substrate, the substrate may undergo heat-treatment by a current or a voltage supplied thereto. That is, heat of 50-200° C. may be applied to the substrate by applying a bias to the substrate without performing an additional heat-treatment process. This may increase crystallinity of the positive active material, and enhance a bonding force between the positive active material and the mixed metal-oxides coating layer.

The step of depositing the mixed metal-oxides on the substrate may be performed under Ar atmospheres. The target and Ar are deposited on the substrate, and the Ar, inactive gas is outcast to the deposited coating layer, thereby forming an amorphous layer.

The present invention also discloses a method of preparing a positive active material for a lithium battery, comprising: preparing an electrode active material; preparing a precursor solution including the electrode active material; and printing the precursor solution on the substrate, and evaporating a solvent at a temperature of 80-120° C. As the precursor solution, may be used a metal compound including a lithium compound, a cobalt compound, a nickel compound, a manganese compound, an iron compound, a titanium compound, etc. More concretely, the lithium compound includes lithium carbonate, lithium nitrate, lithium acetate, lithium hydroxide, etc. The cobalt compound includes cobalt carbonate, cobalt hydroxide, cobalt nitrate, cobalt acetate, etc. The nickel compound includes nickel hydroxide, nickel nitrate, nickel acetate, etc. And, the manganese compound includes manganese hydroxide, manganese nitrate, manganese acetate, etc. However, the present invention is not limited to this. Furthermore, the iron compound and titanium compound may be implemented as the above materials. However, the present invention is not limited to this.

Hereinafter, will be explained a method of preparing a thin film positive active material for a lithium secondary battery, surface-coated with amorphous mixed metal-oxides.

Firstly, a target (4 in. in diameter) corresponding to metal of a positive active material was deposited on a Pt positive electrode on a substrate with an area of 1 cm². Then, under conditions of a pressure of 6 mTorr and a fixed flow ratio between $Ar:O_2$ of 9:1, power of 200 W was applied to the substrate to perform a pre-sputtering process for one hour, and then the positive active material was deposited on the substrate. In order to enhance crystallinity of the deposited positive active material, a rapid thermal annealing (RTA) process was performed. Then, the substrate was heat-treated at a high temperature of 650° C. for five minutes under Ar atmospheres. Then, metal chips were put on the target to deposit a surface coating layer, amorphous mixed metal-oxides on the target by using an RF magnetron sputter. Then, additional heat-treatment was performed at a temperature of 400° C. so as to enhance a bonding force between the positive active material and the surface coating layer.

A deposition thickness of each sample was measured by an alphastep surface profiler, and was controlled by controlling a sputtering time. Here, the amorphous mixed metal-oxides used as the surface coating layer has obtained its desired composition by controlling the number of the metal chips on a target. And, it was possible to freely control each oxide composition from 0 to 100%. For preparation of a powder type positive active material, a power type positive active material may undergo a sputtering process in the same manner as the above manner.

In order to test an electrochemical performance of the electrode surface-coated with the amorphous mixed metal-oxides, a half-cell was assembled. The positive active material surface-coated with the amorphous mixed metal-oxides was used as one electrode, whereas a lithium foil was used as a counter electrode. And, an electrolyte that 1 M $LiPF_6$ was dissolved in a mixed organic solvent between ethyl carbonate and dimethyl carbonate (hereinafter, will be referred to 'EC/DMC solution') is injected into a porous separation film formed of polypropylene having a thickness of 20 µm. Accordingly, the electrolyte is positioned between the two electrodes, thereby assembling the pouch type half-cell. This assembly process is performed at a dry room having a dewpoint temperature less than −58° C.

Hereinafter, the present invention will be explained in more detail with reference to the following examples.

EXAMPLE 1

Figure 1:
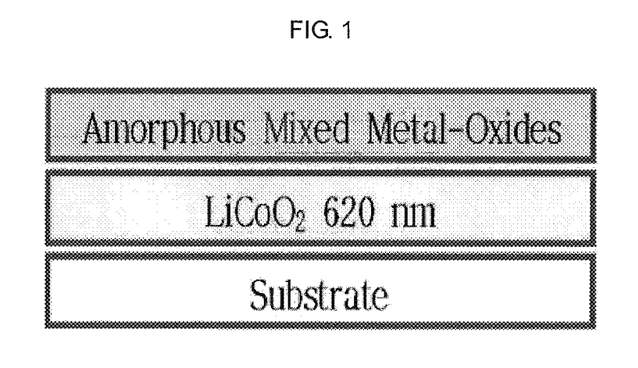
FIG. 1 is a schematic view of a positive active material for a lithium secondary battery using amorphous mixed metal oxides as a surface coating layer.

In this Example 1, was prepared a $LiCoO_2$ thin film positive active material coated with mixed metal-oxides of $ZrO_x$ (1.2 at. %)+Al$_2$O$_3$. FIG. 1 is a structural view of an electrode surface-coated with amorphous mixed metal-oxides according to the present invention. From the lower side, the electrode was sequentially deposited with a substrate, LiCoO$_2$ (620 nm), and amorphous mixed metal-oxides (ZrO$_x$(1.2 at. %)+Al$_2$O$_3$, 5-45 nm).

Hereinafter, will be explained a method of preparing the electrode.

Firstly, LiCoO$_2$ was deposited on the substrate with a thickness of 620 nm. In order to enhance crystallinity of the deposited positive active material, LiCoO$_2$, a rapid thermal annealing (RTA) process was performed. This RTA process was performed at a high temperature of 650° C. at a pressure of 300 mTorr for five minutes under Ar atmospheres. In order to prevent damages due to drastic temperature changes, temperature increment and temperature decrement were performed by 1° C. per second.

Then, the substrate was sputtered by using a target that metal (Zr) was put on Al$_2$O$_3$ having a purity of 99.99%, thereby coating the surface of the deposited LiCoO$_2$ with the mixed metal-oxides. In order to enhance a bonding force between the LiCoO$_2$ electrode and the mixed metal-oxides, an additional heat-treatment process was performed at a temperature of 400° C.

The positive active material surface-coated with the mixed metal-oxides was used as one electrode, whereas a lithium foil was used as a counter electrode. And, an electrolyte that 1 M LiPF$_6$ was dissolved in a mixed solution ('EC/DMC'=1: 1) is injected into a porous separation film formed of polypropylene having a thickness of 20 μm, thereby assembling a cell. This assembly process is performed at a dry room having a dew-point temperature less than −58° C.

Figure 2:
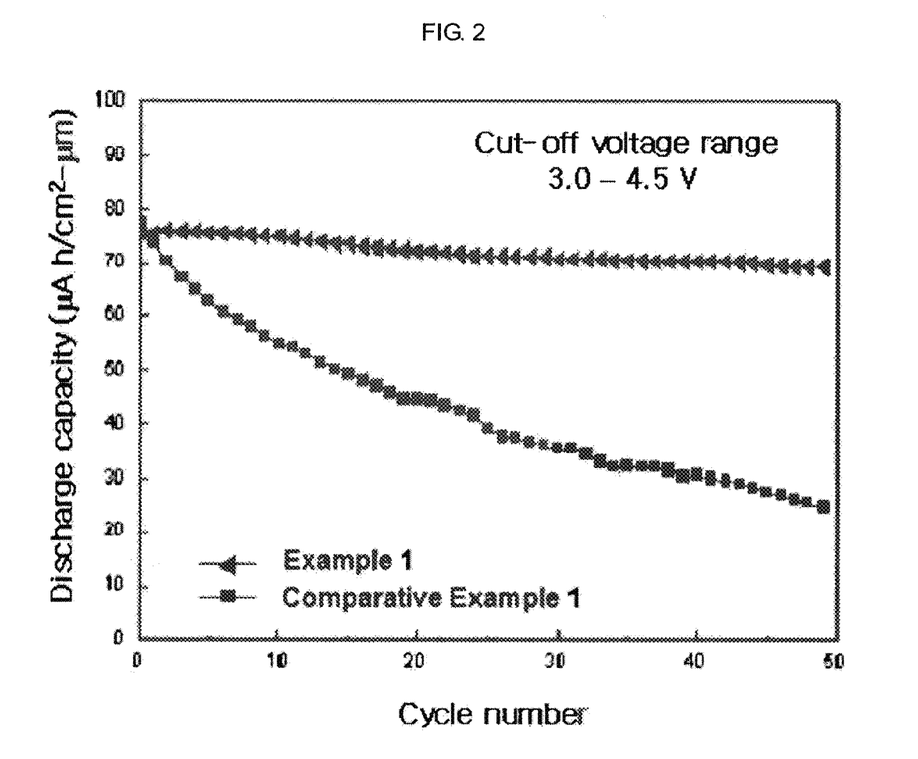
FIG. 2 is a graph showing cycle performance of a lithium secondary battery prepared by using a positive active material surface-coated with amorphous mixed metal-oxides prepared in Example 1 and Comparative Example.

A half-cell was set to have a current density of 100 μA/cm$^2$, a discharge (deoxidation) cut-off voltage of 3.0V (vs. Li/Li$^+$), and a charge (oxidation) cut-off voltage of 4.5V (vs. Li/Li$^+$). Under these conditions, cycle performance was experimented. The experimental results were shown in FIG. 2, which compared the LiCoO$_2$ thin film positive electrode surface-coated with the amorphous mixed metal-oxides (ZrO$_x$ (1.2 at. %)+Al$_2$O$_3$) with a LiCoO$_2$ thin film positive electrode having undergone no surface-coating. At the initial stage, the two samples exhibited nearly the same discharge capacity of 77.70 μA h/cm$^2$-μm. However, as the charge and discharge were performed, the LiCoO$_2$ thin film positive electrode having undergone no surface-coating exhibited drastic capacity decrement, and maintained discharge capacity corresponding to 31.81% of the initial discharge capacity after 50 cycles. On the contrary, the LiCoO$_2$ thin film positive electrode surface-coated with the amorphous mixed metal-oxides (ZrO$_x$(1.2 at. %)+Al$_2$O$_3$) according to the present invention did not exhibit drastic capacity decrement, but exhibited excellent cycle performance and high discharge capacity corresponding to 91.5% of the initial discharge capacity. From these experiments, it could be tested that the positive active material surface-coated with the amorphous mixed metal-oxides (ZrO$_x$(1.2 at. %)+Al$_2$O$_3$) exhibited more excellent cycle performance than the positive active material having undergone no surface-coating.

EXAMPLE 2

Figure 3:
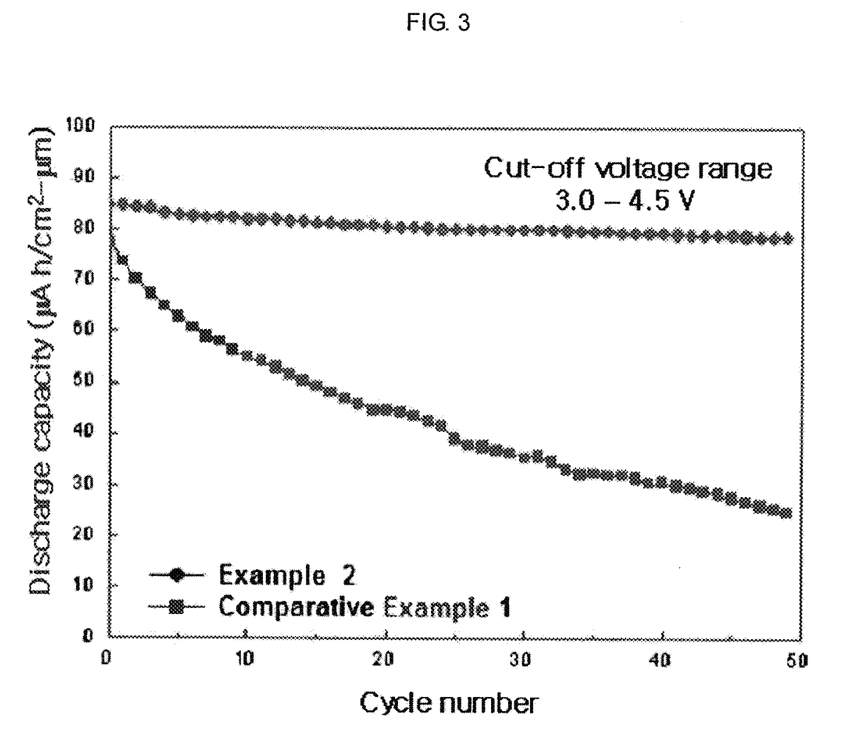
FIG. 3 is a graph showing cycle performance of a lithium secondary battery prepared by using a positive active material surface-coated with amorphous mixed metal-oxides prepared in Example 2 and Comparative Example.

A thin film positive active material having amorphous mixed metal-oxides (TiO$_x$+Al$_2$O$_3$) as an upper layer according to the present invention has the following structure. From the lower side, the electrode was sequentially deposited with a substrate, LiCoO$_2$ (620 nm), and amorphous mixed metal-oxides (TiO$_x$(1.2 at. %)+Al$_2$O$_3$, 5-45 nm). The multi-layered thin film was deposited and heat-treated by the same procedures as in Example 1, except for the composition of the amorphous mixed metal-oxides (TiO$_x$(1.2 at. %)+Al$_2$O$_3$), a surface coating layer. The surface coating layer used as the upper layer was controlled to have the TiO$_x$ composition of 1.2 at. %, by controlling the number of Ti chips on an Al$_2$O$_3$ target having a purity of 99.99%. The deposited LiCoO$_2$ thin film positive active material was used to assemble a half-cell in the same manner as in Example 1, and then cycle performance was experimented. Referring to FIG. 3, when charge and discharge processes were performed 50 times, a LiCoO$_2$ thin film positive active material having undergone no surface-treatment maintained discharge capacity corresponding to 31.81% of the initial discharge capacity. On the contrary, the LiCoO$_2$ thin film positive active material surface-treated with the amorphous mixed metal-oxides (TiO$_x$(1.2 at. %)+Al$_2$O$_3$) according to the present invention maintained very excellent discharge capacity corresponding to 92.95% of the initial capacity even after charge and discharge processes were performed 50 times. And, Example 2 exhibited the initial capacity of 84.67 μA h/cm$^2$-μm higher than the initial capacity of 75.48 μA h/cm$^2$-μm in Example 1 that Zr was added to the surface coating layer.

EXAMPLE 3

Figure 4:
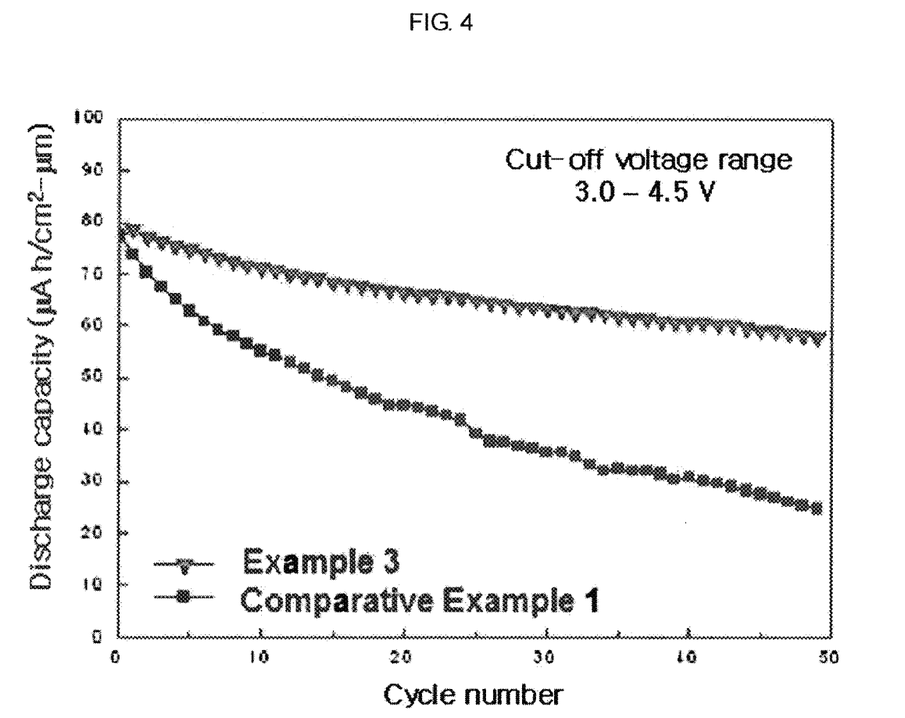
FIG. 4 is a graph showing cycle performance of a lithium secondary battery prepared by using a positive active material surface-coated with amorphous mixed metal-oxides prepared in Example 3 and Comparative Example.

A thin film positive active material having amorphous mixed metal-oxides (CuO$_x$+Al$_2$O$_3$) as an upper layer according to the present invention has the following structure. From the lower side, the electrode was sequentially deposited with a substrate, LiCoO$_2$ (620 nm), and amorphous mixed metal-oxides (CuO$_x$ (1.2 at. %)/+Al$_2$O$_3$, 5-45 nm). The multi-layered thin film was deposited and heat-treated by the same procedures as in Example 1, except for the composition of the amorphous mixed metal-oxides (CuO$_x$ (1.2 at. %)+Al$_2$O$_3$), a surface coating layer. The surface coating layer used as the upper layer was controlled to have the CuO$_x$ composition of 1.2 at. %, by controlling the number of Cu chips on an Al$_2$O$_3$ target having a purity of 99.99%. The deposited LiCoO$_2$ thin film positive active material was used to assemble a half-cell in the same manner as in Example 1, and then cycle performance was experimented. Referring to FIG. 4, when charge and discharge processes were performed 50 times, the LiCoO$_2$ thin film positive active material surface-treated with the amorphous mixed metal-oxides (CuO$_x$ (1.2 at. %)+Al$_2$O$_3$) according to the present invention maintained discharge capacity corresponding to 64.66% of the initial capacity even after charge and discharge processes were performed 50 times. Here, the discharge capacity of the LiCoO$_2$ thin film positive active material according to the present invention when charge and discharge capacity were performed 50 times was higher than a LiCoO$_2$ thin film positive active material having undergone no surface-treatment by about 2 times.

EXAMPLE 4

Figure 5:
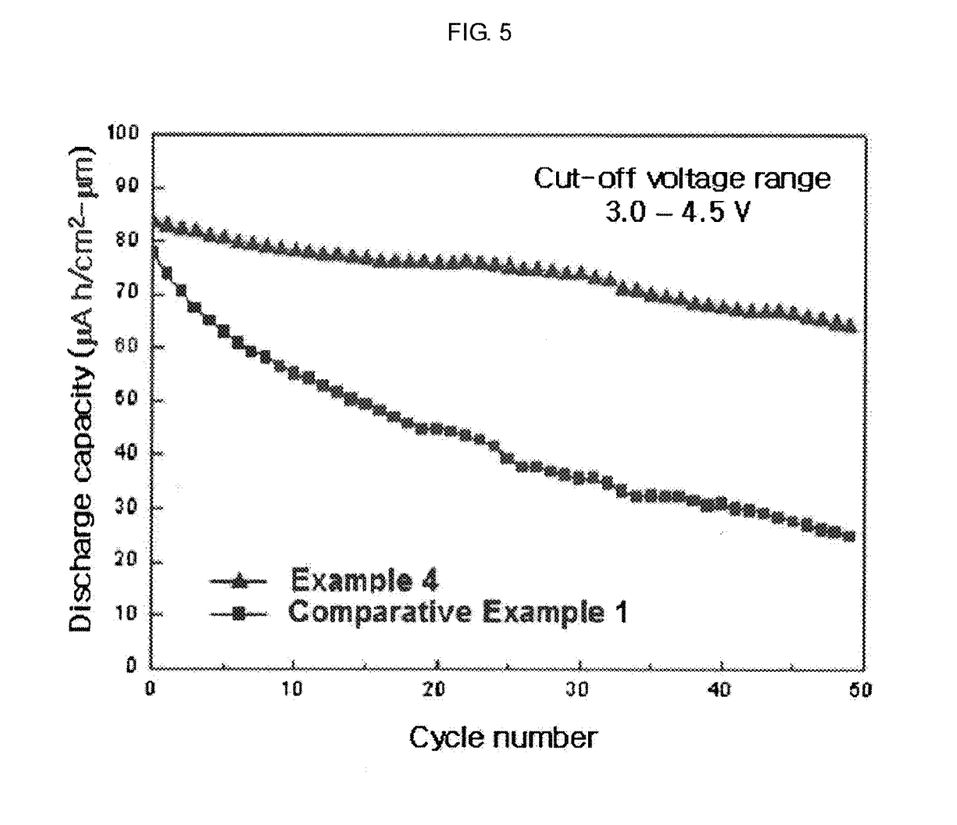
FIG. 5 is a graph showing cycle performance of a lithium secondary battery prepared by using a positive active material surface-coated with amorphous mixed metal-oxides prepared in Example 4 and Comparative Example.

A thin film positive active material having amorphous mixed metal-oxides (TiO$_x$+ZrO$_2$) as an upper layer according to the present invention has the following structure. From the lower side, the electrode was sequentially deposited with a substrate, LiCoO$_2$ (620 nm), and amorphous mixed metal-oxides (TiO$_x$ (1.27 at. %)+ZrO$_2$, 5-45 nm). The multi-layered thin film was deposited and heat-treated by the same procedures as in Example 1, except for the composition of the amorphous mixed metal-oxides (TiO$_x$ (1.27 at. %)+ZrO$_2$), a surface coating layer. The surface coating layer used as the upper layer was controlled to have the TiO$_x$ composition of 1.27 at. %, by controlling the number of Ti chips on a $ZrO_2$ target having a purity of 99.99%. The deposited $LiCoO_2$ thin film positive active material was used to assemble a half-cell in the same manner as in Example 1, and then cycle performance was experimented. Referring to FIG. 5, when charge and discharge processes were performed 50 times, a $LiCoO_2$ thin film positive active material having undergone no surface-treatment maintained discharge capacity corresponding to 31.81% of the initial discharge capacity. On the contrary, the $LiCoO_2$ thin film positive active material surface-treated with the amorphous mixed metal-oxides ($TiO_x$(1.27 at. %)+$ZrO_2$) according to the present invention maintained very excellent discharge capacity corresponding to 76.72% of the initial capacity even after charge and discharge processes were performed 50 times.

EXAMPLE 5

A thin film positive active material having amorphous mixed metal-oxides ($TiO_x$+$ZrO_2$) as an upper layer according to the present invention has the following structure. From the lower side, the electrode was sequentially deposited with a substrate, $LiCoO_2$ (30 μm), and amorphous mixed metal-oxides ($TiO_x$ (1.27 at. %)+$ZrO_2$, 5-45 nm). As the $LiCoO_2$ positive active material, used was powder synthesized by using the conventional commercialized solid phase method, solution method, etc. The multi-layered thin film was deposited and heat-treated by the same procedures as in Example 1, except for the composition of the amorphous mixed metal-oxides ($TiO_x$ (1.27 at. %)+$ZrO_2$), a surface coating layer. In Example 5, the $LiCoO_2$ positive active material powder was used instead of the $LiCoO_2$ thin film positive active material. The surface coating layer used as the upper layer was controlled to have the $TiO_x$ composition of 1.27 at. %, by controlling the number of Ti chips on a $ZrO_2$ target having a purity of 99.99%. To 50 ml of NMP where 4 g of PVDF was dissolved, mixed were 9 g of $LiCoO_2$ coated with amorphous mixed metal-oxides ($TiO_x$ (1.27 at. %)+$ZrO_2$), and 6 g of acetylene black. Then, when a suitable viscosity of the mixture had been obtained, the mixture underwent a casting process on an aluminum thin plate. Then, the mixture was dried and rolled, thereby preparing a $LiCoO_2$ positive electrode coated with the amorphous mixed metal-oxides ($TiO_x$ (1.27 at. %)+$ZrO_2$).

Figure 6:
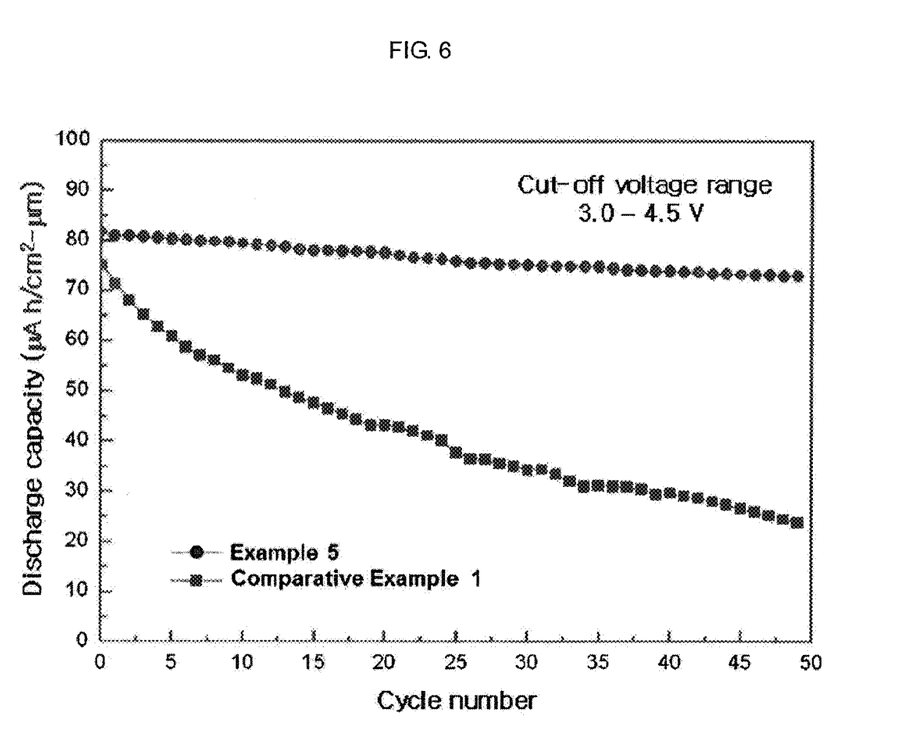
FIG. 6 is a graph showing cycle performance of a lithium secondary battery prepared by using a positive active material surface-coated with amorphous mixed metal-oxides prepared in Example 5 and Comparative Example.

The prepared $LiCoO_2$ positive active material coated with the amorphous mixed metal-oxides ($TiO_x$ (1.27 at. %)+$ZrO_2$) was used to assemble a half-cell in the same manner as in Example 1. Then, cycle performance of the half cell was experimented. As results of the experiments, when charge and discharge processes were performed 50 times, a $LiCoO_2$ positive active material having undergone no surface-treatment maintained discharge capacity corresponding to 31.81% of the initial discharge capacity, which was shown in FIG. 6. On the contrary, the $LiCoO_2$ positive active material coated with the amorphous mixed metal-oxides ($TiO_x$ (1.27 at. %)+$ZrO_2$) maintained discharge capacity corresponding to 92.68% of the initial discharge capacity.

COMPARATIVE EXAMPLE

In order to compare with the half cell prepared by using the positive active material surface-coated with the amorphous mixed metal-oxides according to the present invention, a half cell was prepared by using a $LiCoO_2$ thin film positive active material having undergone no surface-coating. The half cell was prepared in the same manner as in Example 1, except that the $LiCoO_2$ having undergone no surface-process was utilized.

Figure 7A:
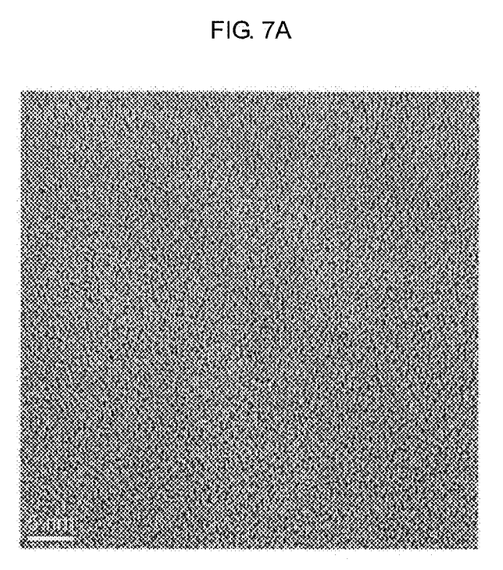
FIGS. 7A and 7B are an electron diffraction image photo and an electron diffraction pattern photo captured by a transmission electron microscope (TEM) after coating the positive active material with mixed metal-oxides of $TiO_x$—$Al_2O_3$ in Example 2.
Figure 7B:
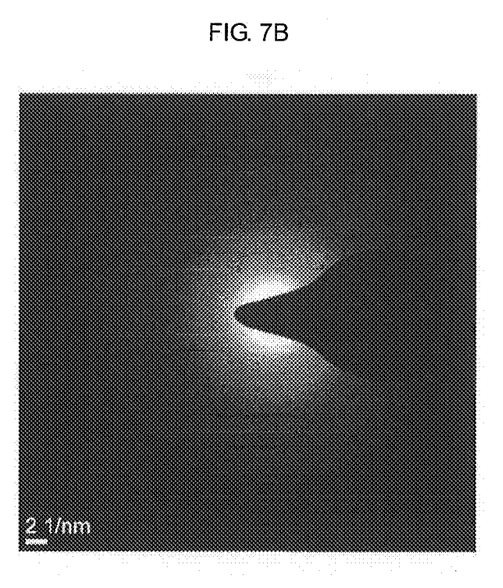

FIGS. 7A and 7B are an electron diffraction image photo and an electron diffraction pattern photo captured by a transmission electron microscope (TEM) after coating the positive active material with mixed metal-oxides of $TiO_x$—$Al_2O_3$ on the substrate according to the deposition processes in Example 2, so as to test characteristics of the coating layer. As shown in FIG. 7A, no diffraction grating having a predetermined shape was observed. And, as shown in FIG. 7B, no electron diffraction pattern was observed. This indicates that the mixed metal-oxides coated on the positive active material is amorphous.

Figure 8:
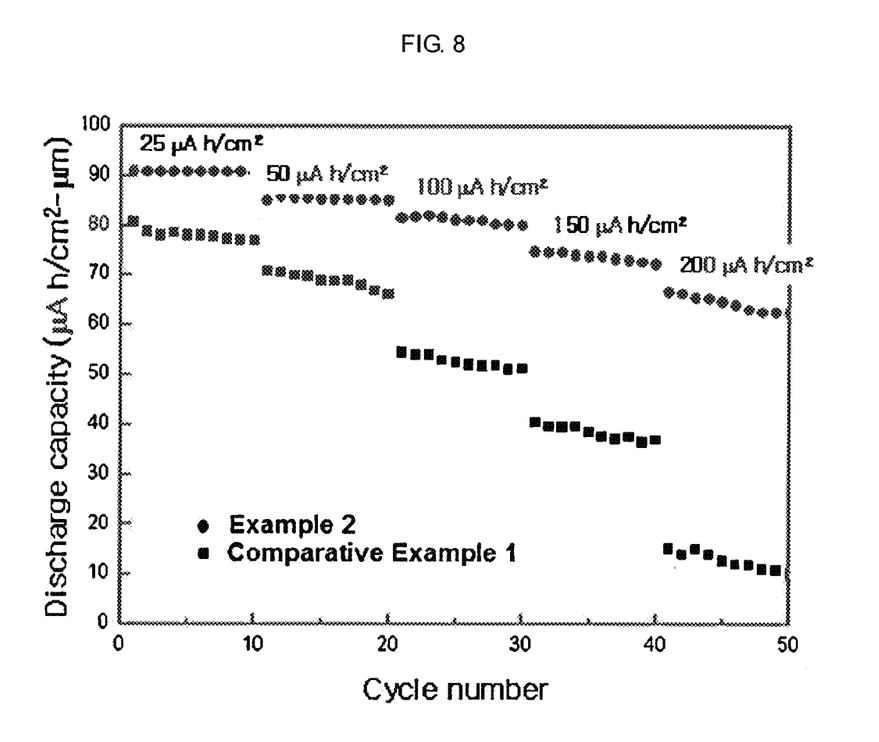
FIG. 8 is a graph showing cycle performance of a lithium secondary battery according to a current density, the lithium secondary battery prepared by using a positive active material prepared in Example 2 and Comparative Example.

FIG. 8 is a graph showing cycle performance of the half cell prepared in Example 2 and Comparative Example according to a current density, in which the current density had speed changes by a charger/discharger having static current/static potential controlled at a room temperature. Static currents were applied to the substrate with changes from 25 μA/cm$^2$ (about 0.5C-rate) to 50 μA/cm$^2$ (about 1C-rate), 100 μA/cm$^2$ (about 2C-rate), 150 μA/cm$^2$ (about 3C-rate), and 200 μA/cm$^2$ (about 4C-rate). And, a discharge (deoxidation) cut-off voltage was fixed to 3.0V (vs. Li/Li$^+$), and a charge (oxidation) cut-off voltage was fixed to 4.5V (vs. Li/Li$^+$). Under the condition of 200 μA/cm$^2$ (about 4C-rate), the positive active material having undergone no surface-treatment in Comparative Example maintained discharge capacity corresponding to 12.66% of discharge capacity under the condition of 25 μA/cm$^2$ (about 0.5C-rate). On the contrary, under the condition of 200 μA/cm$^2$, the positive active material according to Example 2 (surface-coated with $TiO_x$—$Al_2O_3$) maintained discharge capacity corresponding to 68.74% of discharge capacity under the condition of 25 μA/cm$^2$. This enhanced rate performance results from enhanced conductivity.

Figure 9A:
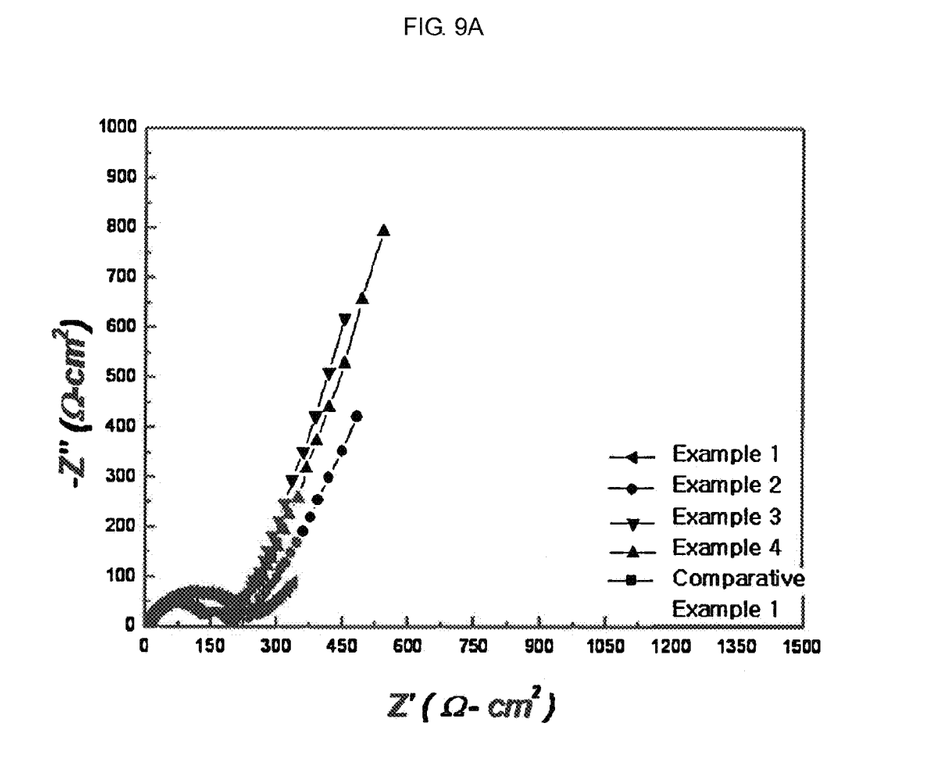
FIGS. 9A and 9B are graphs showing impedances of electrodes according to cycles, the electrodes prepared by using the positive active materials prepared in Examples 1 to 4 according to the present invention and Comparative Example.
Figure 9B:
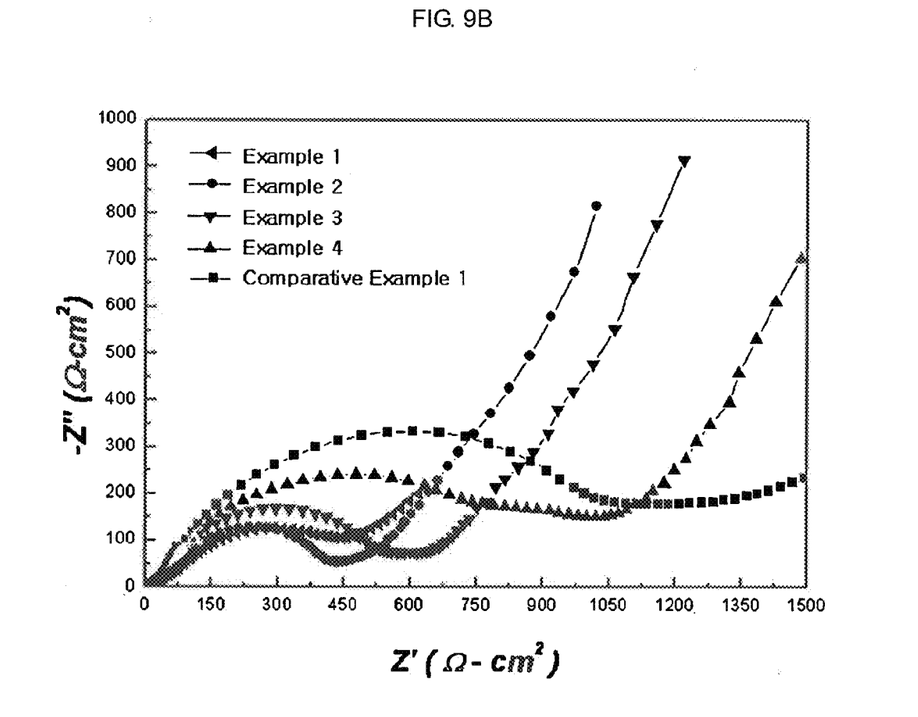

FIGS. 9A and 9B are graphs showing charge/discharge values and electrochemical impedances of electrodes according to cycles, the electrodes prepared by using the positive active materials prepared in Examples 1 to 4 according to the present invention, and Comparative Example (using $LiCoO_2$ thin film positive active material having undergone no surface-treatment). As shown in FIG. 9a, after two cycles, all the $LiCoO_2$ thin film positive electrodes had similar resistance to each other, which was indicated by semi-circles having similar sizes. However, the $LiCoO_2$ thin film positive electrode in Comparative Example having undergone no surface-coating exhibited a semi-circle having comparatively small resistance. This indicates that the surface coating layers of the coated $LiCoO_2$ thin film positive electrodes serve as nonconductors. However, referring to the impedances after 30 cycles as charge and discharge processes are performed, the $LiCoO_2$ thin film positive electrode of the Comparative Example having undergone no surface-treatment had resistance higher than resistance after 2 cycles by about 9 times. Furthermore, the resistance was increased as the Ti composition was increased. However, Example 2 exhibited the smallest resistance change when the number of cycles was increased, which was indicated by a stable semi-circle.

In the present invention, the positive active material surface-coated with the amorphous mixed metal-oxides was prepared by applying a current or a voltage to the substrate while depositing the positive active material and the mixed metal-oxides on the substrate. An inner space of a reactor was maintained in a vacuum state having 1*10$^{-6}$ Torr. Then, Ar was injected into the reactor with 10-40 sccm. Here, a partial pressure was maintained by implementing a processing pressure as 1-7 mTorr, and sputtering target power was maintained as 100-200 W. And, substrate bias power was maintained as 10-1500 W. Under these conditions, sputtering was performed to form an amorphous coating layer.

The foregoing embodiments and advantages are merely exemplary and are not to be construed as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features may be embodied in several forms without departing from the characteristics thereof, it should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

What is claimed is:

1. A method of preparing a positive active material for a lithium battery, comprising the steps of:
   (1) depositing a positive active material on an electrode on a substrate;
   (2) putting metal chips on a metal oxide target and performing a sputtering process, thereby depositing mixed metal-oxides on the positive active material; and
   (3) additionally heat-treating the substrate having the mixed metal-oxides thereon under conditions of temperature of 100-500° C. and pressure of 1-7 mTorr, after the step (2),
   wherein the mixed metal-oxides are amorphous and the step (2) is performed with cooling the metal oxide target to 5-15° C.,
   wherein the metal chips comprise Zr and/or Ti, and
   wherein the metal oxide comprises $AlO_x$ ($0<x\le3$).

2. The method of claim 1, further comprising the step of:
   (1') heat-treating the substrate having the positive active material thereon at a temperature between the steps (1) and (2).

3. The method of claim 2, wherein the step (1') is performed at a temperature of 100-1000° C. for several minutes to one hour under vacuum or atmospheric pressure conditions.

4. The method of claim 1, wherein the step (3) is performed for several minutes to one hour.

5. The method of claim 1, wherein the electrode is a Pt electrode.

6. The method of claim 1, wherein a heat-treatment process is simultaneously performed while depositing the positive active material or the mixed metal-oxides on the substrate by applying a current or a voltage to the substrate in the steps (1) and (2).

7. The method of claim 6, wherein the heat-treatment is performed at a temperature of 50-200° C.

8. The method of claim 1, wherein the step (2) is performed under an Ar atmosphere.

* * * * *